US008896082B1

(12) United States Patent
Okhonin

(10) Patent No.: US 8,896,082 B1
(45) Date of Patent: Nov. 25, 2014

(54) SOLAR CELL SYSTEMS AND INTEGRATION WITH CMOS CIRCUITRY

(71) Applicant: ActLight, S.A., Lausanne (CH)

(72) Inventor: Serguei Okhonin, Lausanne (CH)

(73) Assignee: ActLight, S.A., Lausanne (CH)

( * ) Notice: Subject to any disclaimer, the term of this patent is extended or adjusted under 35 U.S.C. 154(b) by 0 days.

(21) Appl. No.: 13/773,679

(22) Filed: Feb. 22, 2013

Related U.S. Application Data

(60) Provisional application No. 61/614,588, filed on Mar. 23, 2012.

(51) Int. Cl.
*H01L 31/068* (2012.01)
*H01L 31/02* (2006.01)
*H02J 7/00* (2006.01)

(52) U.S. Cl.
CPC ......... *H01L 31/02021* (2013.01); *H01L 31/068* (2013.01); *H02J 7/008* (2013.01)
USPC ...................... 257/462; 257/E31.057; 438/73

(58) Field of Classification Search
CPC . H01L 31/02021; H01L 31/05; H01L 31/068; H02J 7/0077; H02J 7/008
USPC .................. 257/443, 462, E31.057, E31.068, 257/E31.073, E31.083; 438/73
See application file for complete search history.

(56) References Cited

U.S. PATENT DOCUMENTS

| 4,523,217 | A * | 6/1985 | Jibu | 327/514 |
|---|---|---|---|---|
| 6,552,414 | B1 * | 4/2003 | Horzel et al. | 257/655 |
| 6,960,751 | B2 * | 11/2005 | Hiyama et al. | 250/208.1 |
| 7,098,394 | B2 * | 8/2006 | Armer et al. | 136/244 |
| 7,687,864 | B2 * | 3/2010 | Yamamoto | 257/371 |
| 8,274,105 | B2 * | 9/2012 | Koizumi | 257/292 |
| 2008/0084177 | A1 * | 4/2008 | Sander et al. | 320/101 |
| 2010/0155782 | A1 * | 6/2010 | Chang | 257/204 |
| 2012/0187897 | A1 * | 7/2012 | Lenk et al. | 320/101 |
| 2013/0260505 | A1 * | 10/2013 | Bedell et al. | 438/67 |
| 2014/0070223 | A1 * | 3/2014 | Dykaar | 257/66 |

* cited by examiner

*Primary Examiner* — Allan R Wilson
(74) *Attorney, Agent, or Firm* — Wilmer Cutler Pickering Hale and Dorr LLP

(57) ABSTRACT

An integrated circuit-solar cell device comprising a well region of a first dopant type, a solar cell including: (i) a first region disposed in or on the well region, wherein the first region is of the first dopant type, and (ii) a second region disposed outside the well region, wherein the second region is of a second dopant type. The device further includes an integrated circuit including: (i) a first transistor of a first type disposed in or on the well region, and (ii) a second transistor of a second type disposed in or on the first major surface of the substrate and outside the well region. Power management circuitry selectively and electrically couples the solar cell to the battery when the integrated circuit is in an inactive mode.

17 Claims, 8 Drawing Sheets

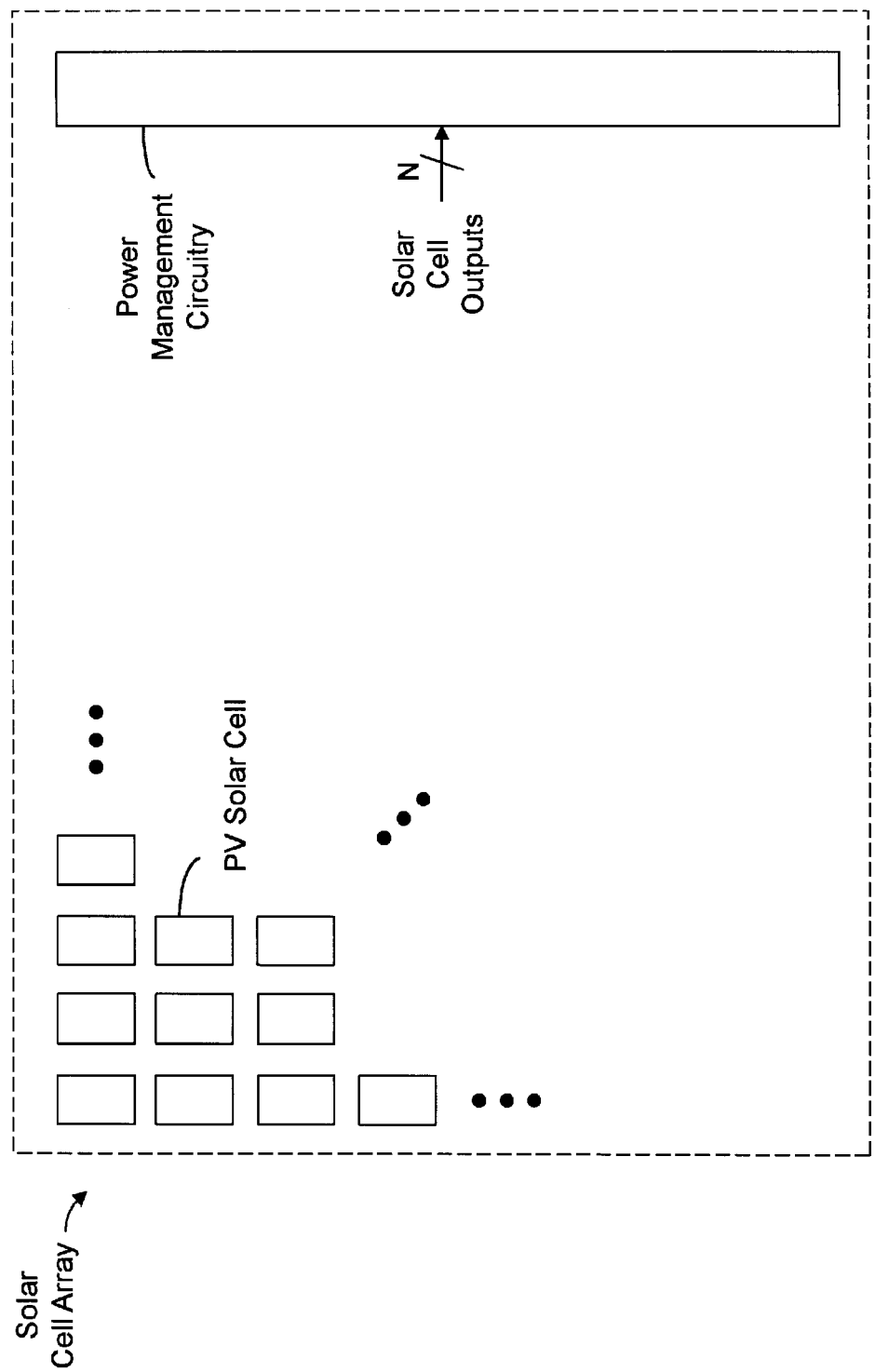

SOLAR CELL SYSTEMS AND INTEGRATION WITH CMOS CIRCUITRY

RELATED APPLICATION

This non-provisional application claims priority to U.S. Provisional Application No. 61/614,588, entitled "Solar Cell Systems and Integration with CMOS Circuitry", filed Mar. 23, 2012; this U.S. Provisional Patent Application is incorporated by reference herein in its entirety.

INTRODUCTION

There are many inventions described and illustrated herein, as well as many aspects and embodiments of those inventions. In one aspect, the present inventions relate to, among other things, a solar cell, incorporated or integrated within CMOS circuitry, to convert energy from light (for example, the sun) into electricity. In another aspect, the present inventions relate to operating such one or more solar cells in connection with the CMOS circuitry. In yet another embodiment, the present inventions relate to circuitry for operating and/or controlling one or more solar cells that are integrated in CMOS circuitry. In addition, the present inventions also relate to methods manufacturing such solar cells and methods manufacturing such solar cells with CMOS circuitry.

SUMMARY

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

Importantly, this Summary may not be reflective of or correlate to the inventions protected by the claims in this or continuation/divisional applications hereof. Even where this Summary is reflective of or correlates to the inventions protected by the claims hereof, this Summary may not be exhaustive of the scope of the present inventions.

In a first aspect, the present inventions are directed to an integrated circuit-solar cell device disposed in or on a first major surface of a substrate, the device comprising a well region disposed in or on the first major surface of the substrate, wherein the well region is of a first dopant type, a solar cell including: (i) a first region disposed in or on the well region, wherein the first region is of the first dopant type, and (ii) a second region disposed in or on the first major surface of the substrate and outside the well region, wherein the second region is of a second dopant type. The device of this aspect further includes an integrated circuit, disposed in the substrate, including: (i) a first transistor disposed in or on the well region, wherein the first transistor is of a first type, and (ii) a second transistor disposed in or on the first major surface of the substrate and outside the well region, wherein the first transistor is of a second type. A power management circuitry, coupled to a battery, is provided to selectively and electrically couple the solar cell to the battery when the integrated circuit is in an inactive mode.

In one embodiment, the first dopant type is a p-type, the second dopant type is an n-type, the first transistor is an NMOS type transistor and the second transistor is a PMOS type transistor. In another embodiment, the first dopant type is an n-type, the second dopant type is a p-type, the first transistor is a PMOS type transistor and the second transistor is an NMOS type transistor.

The power management circuitry may include control circuitry to detect if the integrated circuit is in the inactive mode and, in response thereto, to electrically couple the solar cell to the battery. The power management circuitry may include switch circuitry, electrically coupled between the solar cell and the battery, to responsively and electrically couple the solar cell to the battery when the integrated circuit is in the inactive mode. Indeed, the power management circuitry may include control circuitry and switch circuitry—wherein the control circuitry detects if the integrated circuit is in the inactive mode and, in response, to generate a control signal and the switch circuitry electrically couples the solar cell to the battery in response to the control signal.

The device may also include a doped region in or on a second major surface of the substrate and wherein the doped region enhances the efficiency or operation of the solar cell. In addition thereto, or in lieu thereof, an anti-reflective layer may be disposed in or on doped region on a second major surface of the substrate and wherein the anti-reflective layer enhances the efficiency or operation of the solar cell. Notably, the second major surface may be a surface which is opposite the first major surface.

In another principal aspect, the present inventions are directed to a device including a plurality of integrated circuits and a solar cell array, each of which are disposed in or on a first major surface of a substrate, and power management circuitry. Here, the plurality of integrated circuits, disposed in or on the first major surface of the substrate, include a plurality of NMOS transistors and a plurality of PMOS transistors. The solar cell, disposed in or on the first major surface of the substrate, includes (i) an n-type region juxtaposed a PMOS transistor of the integrated circuits and (ii) a p-type region juxtaposed a NMOS transistor of the integrated circuits. The power management circuitry is coupled to a battery, to selectively and electrically couple the solar cell to the battery when at least a portion of the integrated circuits is in an inactive mode.

The power management circuitry may include control circuitry to detect if the integrated circuits are in the inactive mode and, in response thereto, to electrically couple the solar cell to the battery. The power management circuitry may include switch circuitry, electrically coupled between the solar cell and the battery, to responsively and electrically couple the solar cell to the battery when the integrated circuits are in the inactive mode. Indeed, the power management circuitry may include control circuitry and switch circuitry—wherein the control circuitry detects if the integrated circuits are in the inactive mode and, in response, to generate a control signal and the switch circuitry electrically couples the solar cell to the battery in response to the control signal.

The device may also include a doped region in or on a second major surface of the substrate and wherein the doped region enhances the efficiency or operation of the solar cell. In addition thereto, or in lieu thereof, an anti-reflective layer may be disposed in or on doped region on a second major surface of the substrate and wherein the anti-reflective layer enhances the efficiency or operation of the solar cell.

In yet another aspect, the present inventions are directed to a device including power management circuitry and a plurality of integrated circuits and a plurality of solar cells, wherein each circuit and cell is disposed in or on a first major surface of a substrate. The plurality of integrated circuits, disposed in or on the first major surface of the substrate, include a plurality of PMOS transistors, each PMOS transistor being disposed in or on the first major surface of the substrate and in or on an n-well, and a plurality of NMOS transistors, each NMOS transistor being disposed in or on the first major surface of the substrate and outside of the n-well. The plurality of solar cells are disposed in or on the first major surface of the substrate, wherein each solar cell includes (i) an n-type region in or on an n-well and (ii) a p-type region disposed outside of the n-well. The power management circuitry, coupled to a battery, to selectively and electrically couple at least a subset of the plurality of solar cells to the battery when at least a portion of the integrated circuits is in an inactive mode.

The power management circuitry may include control circuitry to detect if at least the portion of the integrated circuits is in the inactive mode and, in response thereto, to electrically couple at least the subset of the solar cells to the battery. The power management circuitry may include switch circuitry to responsively and electrically couple at least the subset of the solar cells to the battery to the battery when at least the portion of the integrated circuits are in the inactive mode. Indeed, the power management circuitry may include control circuitry and switch circuitry—wherein the control circuitry detects if the portion of the integrated circuits is in the inactive mode and, in response, to generate a control signal and the switch circuitry electrically couples at least the subset of the solar cells to the battery in response to the control signal.

The device may also include a doped region in or on a second major surface of the substrate and wherein the doped region enhances the efficiency or operation of the solar cell. In addition thereto, or in lieu thereof, an anti-reflective layer may be disposed in or on doped region on a second major surface of the substrate and wherein the anti-reflective layer enhances the efficiency or operation of the solar cell.

Notably, the subset of the plurality of solar cells may be a contiguous array of cells or may be a plurality of cells which are dispersed across the die of the device.

As stated herein, there are many inventions, and aspects of the inventions, described and illustrated herein. This Summary is not exhaustive of the scope of the present inventions. Indeed, this Summary may not be reflective of or correlate to the inventions protected by the claims in this or continuation/divisional applications hereof.

Moreover, this Summary is not intended to be limiting of the inventions or the claims (whether the currently presented claims or claims of a divisional/continuation application) and should not be interpreted in that manner. While certain embodiments have been described and/or outlined in this Summary, it should be understood that the present inventions are not limited to such embodiments, description and/or outline, nor are the claims limited in such a manner (which should also not be interpreted as being limited by this Summary).

Indeed, many other aspects, inventions and embodiments, which may be different from and/or similar to, the aspects, inventions and embodiments presented in this Summary, will be apparent from the description, illustrations and claims hereof. In addition, although various features, attributes and advantages have been described in this Summary and/or are apparent in light thereof, it should be understood that such features, attributes and advantages are not required in any of the embodiments of the present inventions and, indeed, need not be present/incorporated in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

FIG. 5A illustrates, in block diagram form, a solar cell array integrated with integrated circuits (for example, CMOS transistors of power management circuitry); notably, such circuits and other components may be integrated or fabricated into selected portions of the die/device using standard fabrication techniques and/or techniques employed to fabricate the solar cell and solar cell array; any of the solar cell configurations and solar cell array architectures (for example, cell architecture illustrated in FIGS. 1 and 4A-4C) may be integrated on a die/device with integrated circuitry as illustrated herein and in accordance with aspects of the present inventions.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

Figure 1:
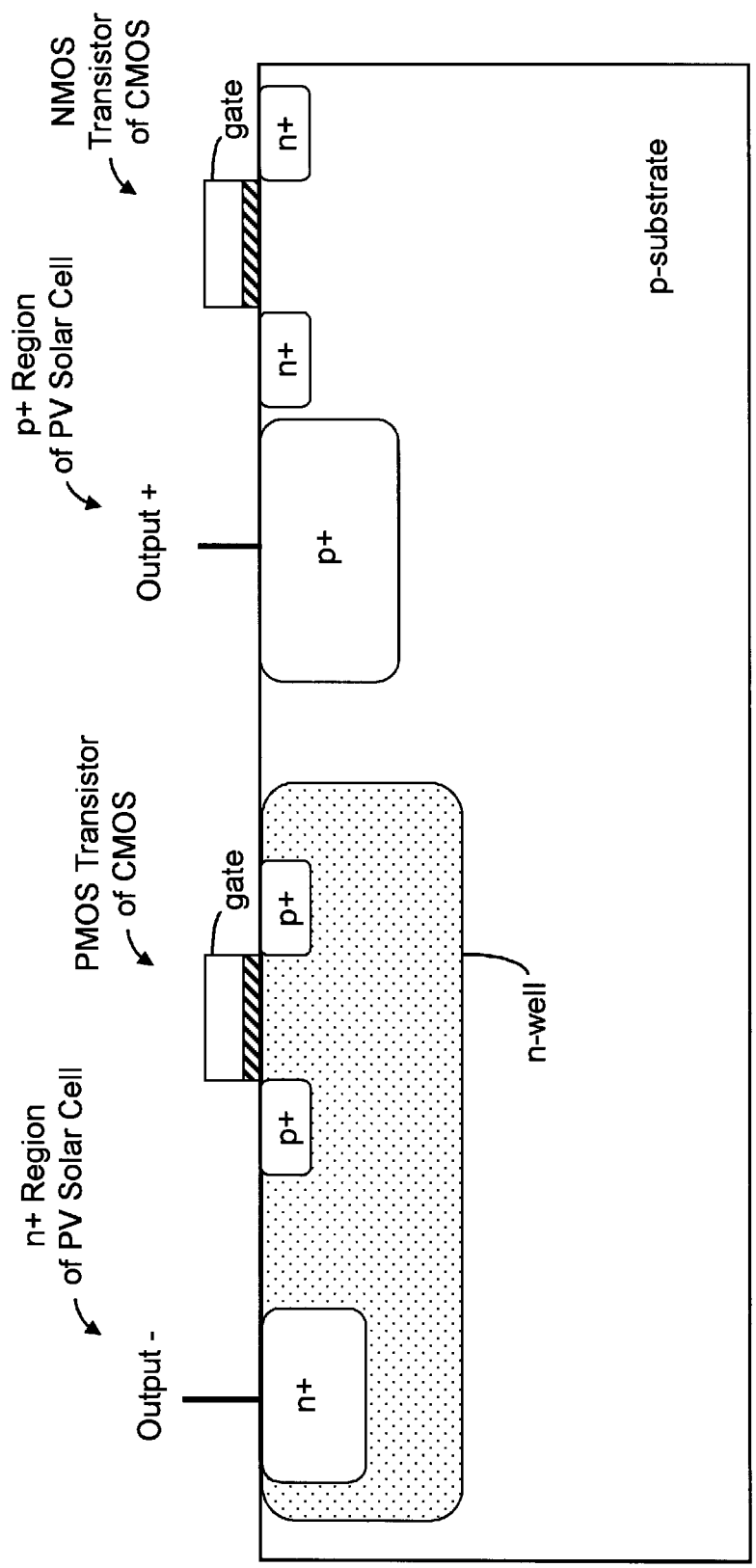
FIG. 1 illustrates an exemplary embodiment of a cross-section of an integration of a solar cell with/in a CMOS cell according to certain aspects and embodiments of the present inventions, wherein the n+ region of the solar cell and the PMOS transistor of the CMOS cell are disposed in an N− region (in this illustrative embodiment, an n-well region) and the p+ region of the solar cell and NMOS transistor of the CMOS cell are located in a P-region (in this illustrative embodiment, a p-substrate); notably, such solar cell and CMOS cell may be a portion of a larger die which, in one embodiment, include one or more additional such solar cells integrated within/in other CMOS circuits.

There are many inventions described and illustrated herein. In one aspect, the present inventions are directed to a solar cell and/or solar cell array, and method of fabricating and/or operating such a solar cell and/or solar cell array. With reference to FIG. 1 (a cross-section of a solar cell integrated in CMOS circuit—which may be a portion of a larger die), in a first embodiment, an n+ region of a photovoltaic/photoelectric solar cell (hereinafter "PV solar cell") and a PMOS transistor are disposed or embedded in an n-well. The p+ region of the PV solar cell and the NMOS transistor are disposed outside the n-well. The PMOS and NMOS transistors form a CMOS transistor pair. In addition, the output of the PV solar cell is connected to the n+ and p+ regions of the PV solar cell.

Notably, where the substrate is an N-type, the NMOS transistor is formed in a p-well and the PMOS transistor is formed adjacent thereto. In this embodiment, the p+ region of the PV solar cell is disposed in the p-well with the NMOS transistor. Further, the n+ region of a PV solar cell is disposed outside of the p-well with the PMOS transistor.

Figure 2:
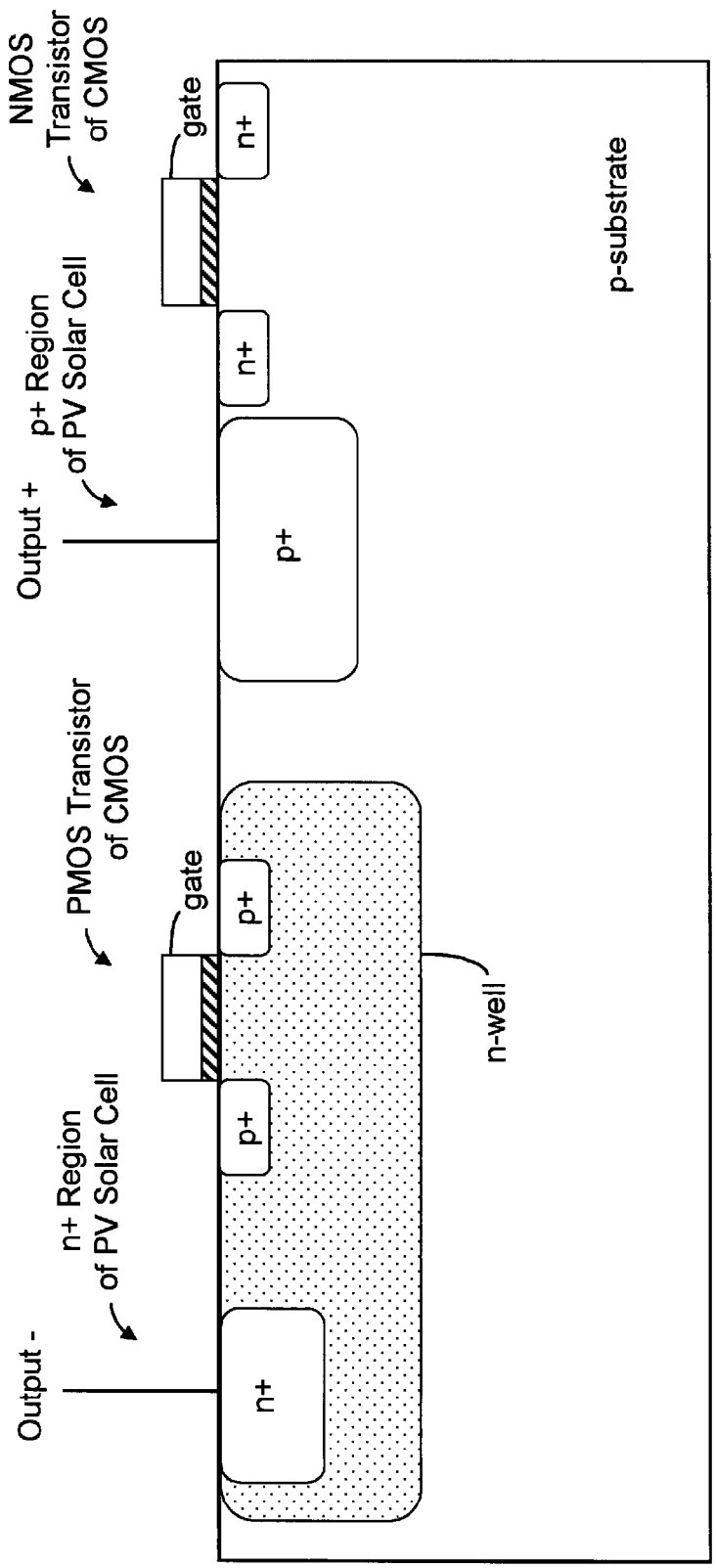
FIG. 2 illustrates an exemplary embodiment of the cross-section of the integration of a solar cell with/in CMOS cell according to FIG. 1 in conjunction with incident light (photon) that may cause the solar cell to generate a current between the outputs of the solar cell during operation, in accordance with certain aspects and embodiments of the present inventions.

Briefly, with reference to FIG. 2, when light impinges upon the substrate a current is generated between the n+ and p+ regions. The operation of the PV solar cell is well understood by those skilled in the art.

In one embodiment, the PV solar cell, in operation, generates current when the CMOS circuitry is "idle", inactive and/or inoperative (for example, when the CMOS circuitry is in a "sleep" mode or period). Conversely, when the CMOS circuitry is active and/or operative (for example, when the CMOS circuitry is in an active mode or period), the PV solar cell is "idle", inactive and/or inoperative and, as such, in this mode does not generate current. Under these circumstances, the PV solar cell does not interfere with the operation of the PMOS or NMOS transistors (e.g., CMOS circuitry).

Figure 3A:
FIGS. 3A and 3B illustrate in block diagram form power management circuitry electrically coupled to a battery, according to certain aspects and embodiments of the present inventions.

With reference to FIG. 3A, in one embodiment, the output of the PV cell is connected through power management circuitry to a battery. As such, in operation, the power management circuitry connects the PV cell to a rechargeable power source (in the exemplary embodiment, such source is illustrated as a battery) when the CMOS circuitry is "idle", inactive and/or inoperative (for example, when the circuitry is in a "sleep" mode or period) and disconnects the PV cell from the rechargeable power source when the CMOS circuitry is active and/or operative (for example, when the CMOS circuitry is in an active mode or period).

Figure 3B:
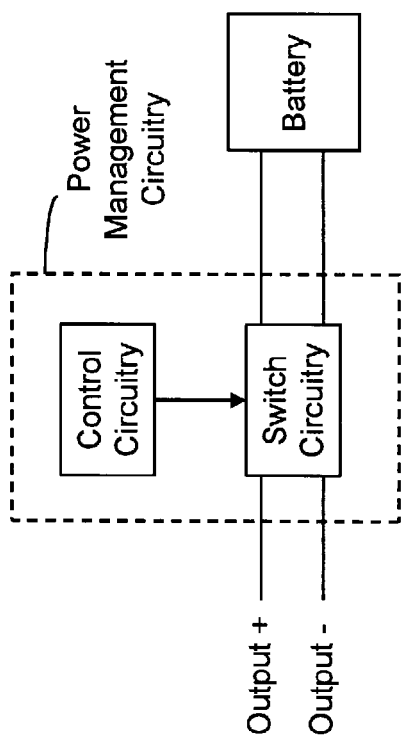

With reference to FIG. 3B, in one embodiment, the power management circuitry may include control circuitry to determine or detect the operability of the CMOS circuitry and, in response thereto, to control the switch circuitry accordingly. That is, when the control circuitry determines or detects the circuitry is in an inactive or inoperative state, the switch circuitry connects the outputs of the PV solar cell to the battery. When the control circuitry determines or detects the circuitry is active or operative, the switch circuitry disconnects the outputs of the PV solar cell from the battery. Notably, any circuitry now known or later developed to implement the operations of the power management circuitry is intended to fall within the scope of the present inventions.

In one embodiment, the CMOS circuitry is, for example, implemented in a sensor device (of any kind or type) which includes an active period (during which the circuitry of the sensor device implements its designed sensing operation) and an inactive period (during which the circuitry (or a portion thereof) is "idle", inactive and/or inoperative—for example, in a "sleep" mode). In this embodiment, the control circuitry detects or determines (or is instructed) when the sensor device is in an active period or an inactive period and responsively enables/disables the PV solar cell.

Figure 4A:
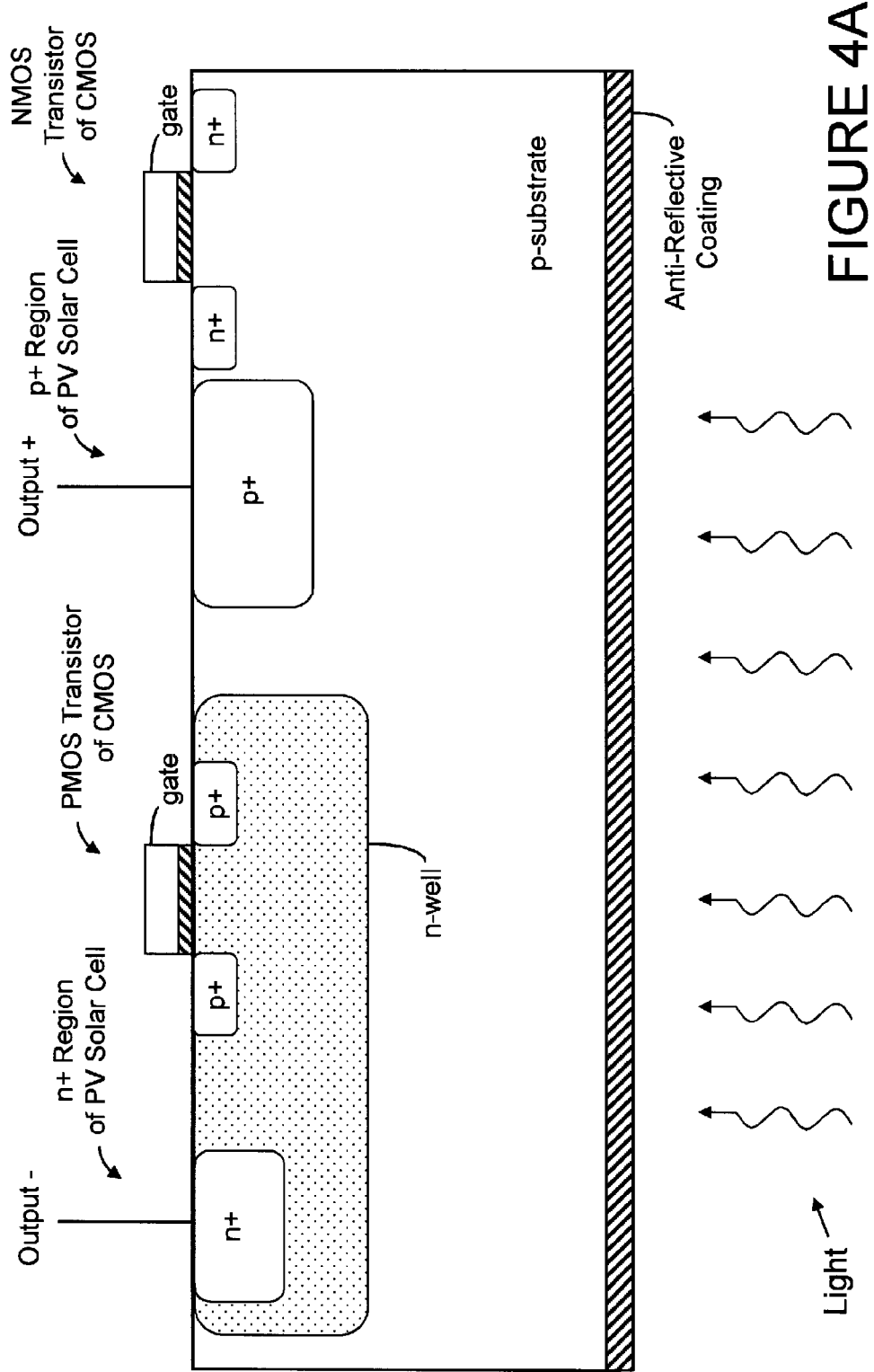
FIG. 4A illustrates an exemplary embodiment of a cross-section of an integration of a solar cell with/in a CMOS cell and including an anti-reflective material on/in a major surface of the die or wafer which is different from (in this exemplary embodiment, opposite from) the major surface in which the integrated circuitry is formed, according to certain aspects and embodiments of the present inventions, wherein the n+ region of the solar cell and the PMOS transistor of the CMOS cell are disposed in an n− region (in this illustrative embodiment, an n-well region) and the p+ region of the solar cell and NMOS transistor of the CMOS cell are located in a p-region (in this illustrative embodiment, a p-substrate); as indicated above, such solar cell and CMOS circuit may be a portion of a larger die which, in one embodiment, include one or more additional such solar cells integrated within/in other CMOS circuits.

With reference to FIG. 4A, in one embodiment, an anti-reflective material is disposed on a portion of the die/wafer which is exposed to incident light (for example, solar light). The anti-reflective material may enhance the efficiency and/or operation of the PV solar cell. Notably, such material is well known to those skilled in the art.

Figure 4B:
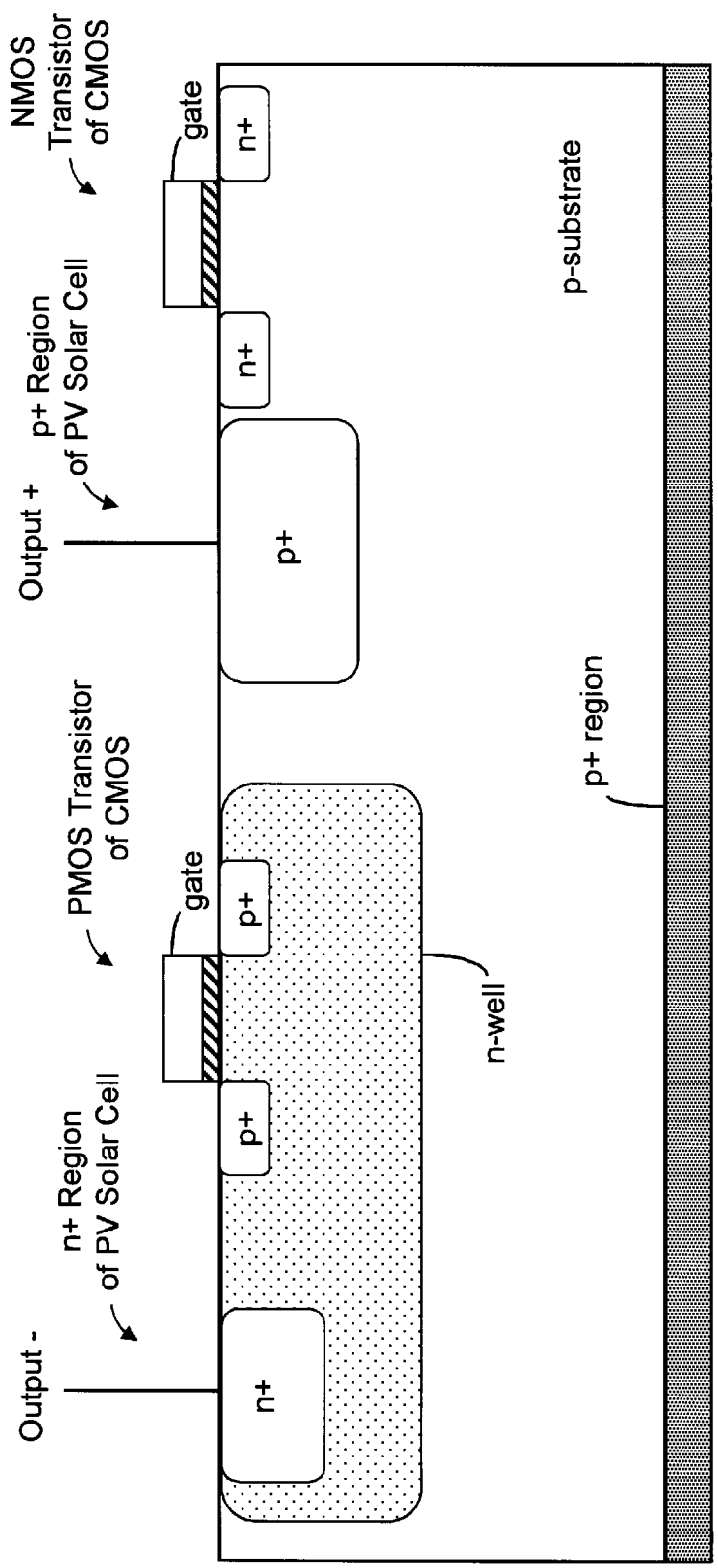
FIG. 4B illustrates an exemplary embodiment of a cross-section of an integration of a solar cell with/in a CMOS cell and including a highly doped region (in this embodiment, a p+ region disposed in a p-substrate) on/in a surface of the die or wafer which is different from (in this exemplary embodiment, opposite from) the major surface in which the integrated circuitry is formed, according to certain aspects and embodiments of the present inventions, wherein the n+ region of the solar cell and the PMOS transistor of the CMOS cell are disposed in an n− region (in this illustrative embodiment, an n-well region) and the p+ region of the solar cell and NMOS transistor of the CMOS cell are located in a p-region (in this illustrative embodiment, a p-substrate); as indicated above, such solar cell and CMOS circuit may be a portion of a larger die which, in one embodiment, include one or more additional such solar cells integrated within/in other CMOS circuits.
Figure 4C:
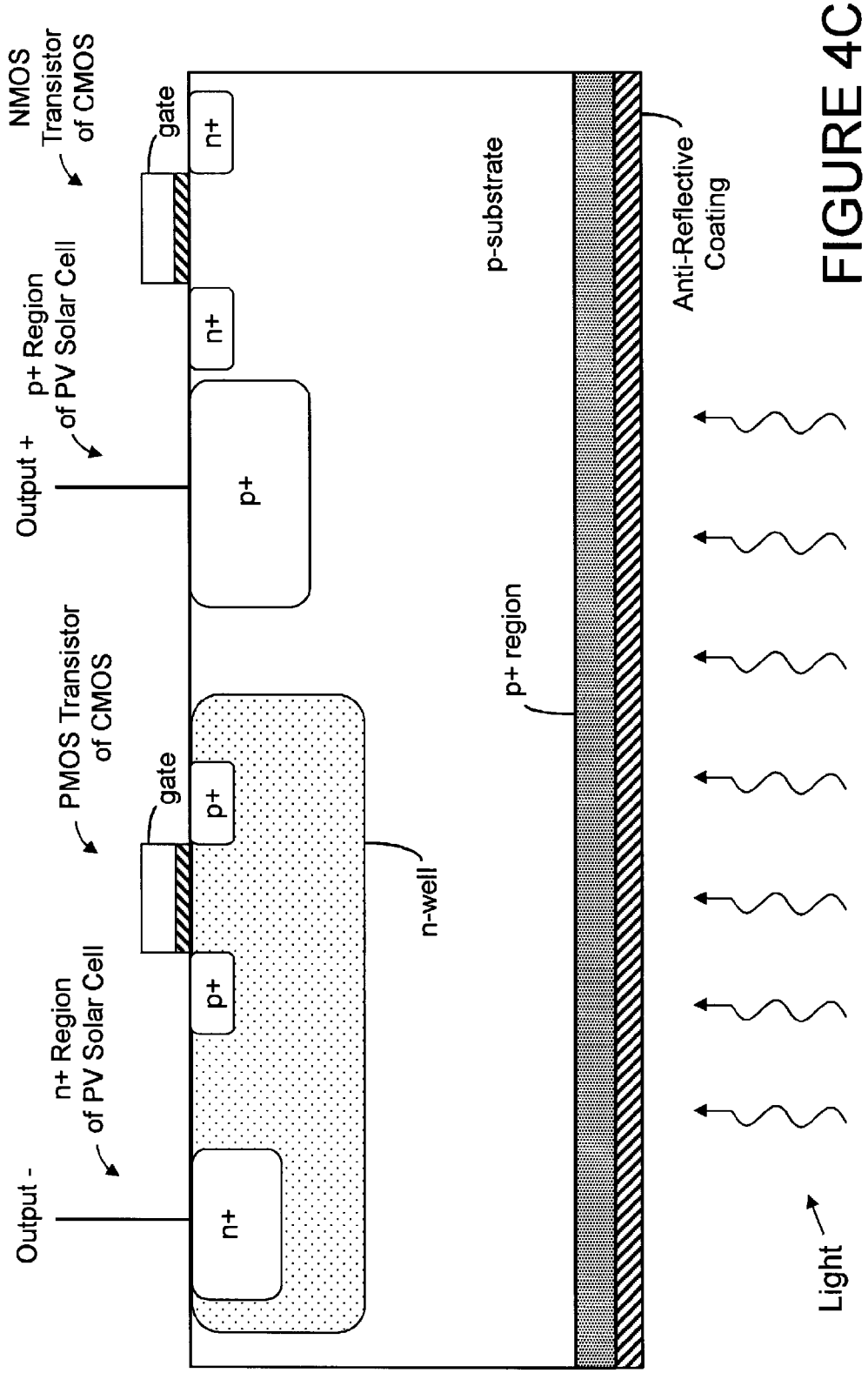
FIG. 4C illustrates an exemplary embodiment of a cross-section of an integration of a solar cell with/in a CMOS cell and including an anti-reflective material and a highly doped region (in this embodiment, a p+ region disposed in a p-substrate) on/in a surface of the die or wafer which is different from (in this exemplary embodiment, opposite from) the major surface in which the integrated circuitry is formed, according to certain aspects and embodiments of the present inventions, wherein the n+ region of the solar cell and the PMOS transistor of the CMOS cell are disposed in an n−region (in this illustrative embodiment, an n-well region) and the p+ region of the solar cell and NMOS transistor of the CMOS cell are located in a p-region (in this illustrative embodiment, a p-substrate); as indicated above, such solar cell and CMOS circuit may be a portion of a larger die which, in one embodiment, include one or more additional such solar cells integrated within/in other CMOS circuits.

In another embodiment, a p+ region is implanted, formed, deposited and/or grown on a portion of the die/wafer which is exposed to incident light. (See, for example, FIG. 4B). Here, the impurities of the p+ region may also enhance the efficiency and/or operation of the PV solar cell. Notably, in another embodiment, the anti-reflective material and a p+ region are both implemented to enhance the synergistically enhance the efficiency and/or operation of the PV solar cell. (See, for example, FIG. 4C).

Moreover, in those embodiments where an IC die includes a first portion of circuitry which is less active than a second portion of circuitry, it may be advantageous to dispose or integrate the PV solar cells with the less active circuitry (i.e., the first portion) wherein the second portion of circuitry would not include PV solar cells.

In one embodiment, when the IC die is disabled, unpowered and/or "powered-down", it may be advantageous to maintain a sufficient (for example, minimum) amount of power to the switch circuitry so that the one or more PV solar cells, when the IC is in a unpowered state, are providing electrical current to the rechargeable power source. In this embodiment, even if the device is electrically "off", the switch circuitry provides electrical connection between the PV solar cells and the rechargeable battery.

Figure 5B:
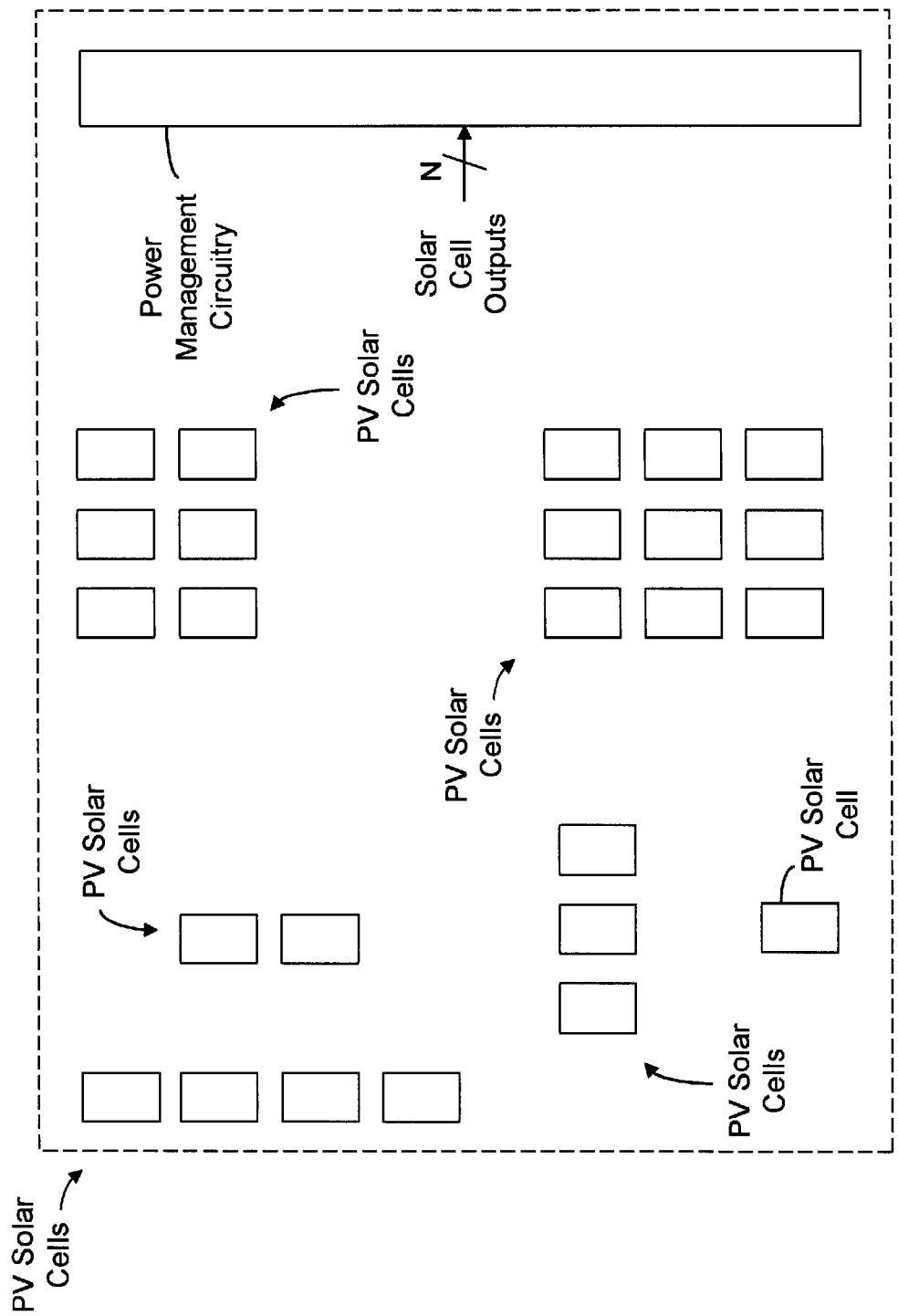
FIG. 5B illustrates, in block diagram form, a plurality of solar cells incorporated with integrated circuits (for example, CMOS transistors of power management circuitry); notably, the solar cells may be integrated or fabricated into selected portions of the die/device, for example, as an array (of any size or shape) and/or as a single cell, using standard fabrication techniques and/or techniques employed to fabricate the integrated circuits; any of the solar cell configurations and solar cell array architectures (for example, cell architecture illustrated in FIGS. 1 and 4A-4C) may be integrated on a die/device with integrated circuitry as illustrated herein and in accordance with aspects of the present inventions.

In addition, in one embodiment, the PV solar cells are arranged in an array such that the PV solar cells are disposed in contiguous portions of CMOS circuitry. (See, for example, FIG. 5A). In this embodiment, the switch circuitry may be arrayed as well or more centralized so that a first switch circuitry is associated with a plurality of PV solar cells. Moreover, the control circuitry may also be centralized so that such circuitry is associated with a plurality of switch circuitry.

In another embodiment, the PV solar cells are located on the die in an array and/or as a single cell wherein one or more of the cells are disposed in contiguous portions of CMOS circuitry. (See, for example, FIG. 5B). Although in this exemplary illustrated embodiment the switch circuitry is arrayed as well or more centralized so that a first switch circuitry is associated with a plurality of PV cells, the one or more portions of the switch circuitry may be dispersed and/or non-centralized. Moreover, the control circuitry may also be centralized or non-centralized whether or not the switch circuitry is centralized or non-centralized.

Notably, the solar cells—CMOS circuitry configurations of the present inventions may be implemented in any architecture as well as in conjunction with any type of integrated circuitry, whether now known or later developed; all such configurations are intended to fall within the scope of the present inventions. Further, any manufacturing technique, whether now known or later developed, may be employed to fabricate the PV solar cell, PV solar cell array (which includes a plurality of PV solar cells) and/or CMOS circuitry and integrated circuit device; all such techniques are intended to fall within the scope of the present inventions. Indeed, one or more PV solar cells, as integrated with CMOS circuitry, may be fabricated using standard and well-known manufacturing processes and techniques.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

In certain embodiments, the PV solar cell—CMOS circuitry of the present inventions, may be implemented:

- in sensor devices having a sleeping mode, wherein a part of circuitry remains or becomes active (for example, periodically or intermittently);
- in those embodiments where existing N-wells and p+ contacts are employed to create a PV solar cells (to charge a rechargeable power source);
- where the IC provides for back-side illumination;
- where normally different n-wells are connected in parallel, wherein, in one embodiment, the p+ contacts are also connected in parallel;
- where existing n-wells and p+ contacts are rearranged to improve cell efficiency;
- where additional n-wells or p+ contacts are implemented to increase the number of PV solar cells;
- in those situations where a twin-well process p-wells is employed wherein such well may be used instead of p+ contacts.

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, many of those permutations and combinations will not be discussed and/or illustrated separately herein.

Although the present inventions have been illustrated having planar-type transistors of the integrated circuitry, the present inventions may be implement in conjunction with any transistor configuration—including standard planar layout transistors and/or multiple gate transistors (for example, FinFET, double gate (for example, planar or vertical type), triple gate, or pillar gate architectures). For the sake of brevity, transistors implementing multiple gate technologies will not be illustrated and/or discussed separately in detail. This notwithstanding, the transistors of the integrated circuitry may include a single gate and/or multiple gate architectures made with any planar or 3D technology now known or later developed. Single gate or multiple gate transistors (regardless of the 3D technology employed) are intended to fall within the scope of the present inventions.

It should be noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form, which may be a single bit (or the like) or multiple bits (or the like).

The solar cell structures, circuits and/or circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The present inventions are also directed to such representation of the circuitry described herein, and/or techniques implemented thereby, and, as such, are intended to fall within the scope of the present inventions.

Indeed, when received within a computer system via one or more computer-readable media, such data and/or instruction-based expressions of the above described structures, circuits and/or circuitry may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various solar cell structures, circuits and/or circuitry, as well as techniques, disclosed herein may be represented via simulations and simulation instruction-based expressions using computer aided design, simulation and/or testing tools. The simulation of the solar cells and solar cell arrays of the present inventions, manufacturing processes to fabricate such cells and arrays, and/or techniques implemented thereby, may be implemented by a computer system wherein characteristics and operations of such circuitry, and techniques implemented thereby, are simulated, imitated, replicated, analyzed and/or predicted via a computer system. The present inventions are also directed to such simulations and testing of the inventive solar cells and solar cell arrays, efficiencies thereof, and/or techniques implemented thereby, and, as such, are intended to fall within the scope of the present inventions. The computer-readable media and data corresponding to such simulations and/or testing tools are also intended to fall within the scope of the present inventions.

Notably, in the claims, the term, "inactive mode" means idle, inactive and/or inoperative mode or state (for example, in the context of integrated circuitry, in a "sleep", "hibernate", inactive or inoperative mode or state).

What is claimed is:

1. An integrated circuit-solar cell device disposed in or on a first major surface of a substrate, the device comprising:
   a well region disposed in or on the first major surface of the substrate, wherein the well region is of a first dopant type;
   a doped region disposed in or on a second major surface, opposing the first major surface, of the substrate, wherein the doped region enhances the efficiency or operation of the solar cell;
   a solar cell including:
      a first region disposed in or on the well region, wherein the first region is of the first dopant type; and
      a second region disposed in or on the first major surface of the substrate and outside the well region, wherein the second region is of a second dopant type;
   an integrated circuit, disposed in the substrate, including:
      a first transistor disposed in or on the well region, wherein the first transistor is of a first type; and
      a second transistor disposed in or on the first major surface of the substrate and outside the well region, wherein the first transistor is of a second type; and
   power management circuitry, coupled to a battery, to selectively and electrically couple the solar cell to the battery when the integrated circuit is in an inactive mode.

2. The device of claim 1 wherein the first dopant type is a p-type, the second dopant type is an n-type, the first transistor is an NMOS type transistor and the second transistor is a PMOS type transistor.

3. The device of claim 1 wherein the first dopant type is an n-type, the second dopant type is a p-type, the first transistor is a PMOS type transistor and the second transistor is an NMOS type transistor.

4. The device of claim 1 wherein the power management circuitry includes switch circuitry, electrically coupled between the solar cell and the battery, to responsively and electrically couple the solar cell to the battery when the integrated circuit is in the inactive mode.

5. The device of claim 1 wherein the power management circuitry includes:
   control circuitry to detect if the integrated circuit is in the inactive mode and, in response, to generate a control signal; and
   switch circuitry to electrically couple the solar cell to the battery in response to the control signal.

6. The device of claim 1 wherein the power management circuitry includes control circuitry to detect if the integrated circuit is in the inactive mode and, in response thereto, to electrically couple the solar cell to the battery.

7. The device of claim 1 further including an anti-reflective layer disposed in or on doped region on a second major surface of the substrate and wherein the anti-reflective layer enhances the efficiency or operation of the solar cell.

8. A device including a plurality of integrated circuits and a solar cell, each of which are disposed in or on a first major surface of a substrate, the device comprising:
   the plurality of integrated circuits, disposed in or on the first major surface of the substrate, including a plurality of NMOS transistors and a plurality of PMOS transistors;
   a doped region disposed in or on a second major surface, opposing the first major surface, of the substrate, wherein the doped region enhances the efficiency or operation of the solar cell;
   a solar cell disposed in or on the first major surface of the substrate, wherein the solar cell includes (i) an n-type region juxtaposed a PMOS transistor of the integrated circuits and (ii) a p-type region juxtaposed a NMOS transistor of the integrated circuits; and power management circuitry, coupled to a battery, to selectively and electrically couple the solar cell to the battery when at least a portion of the integrated circuits is in an inactive mode.

9. The device of claim 8 wherein the power management circuitry includes switch circuitry, electrically coupled between the solar cell and the battery, to responsively and electrically couple the solar cell to the battery when the portion of the integrated circuits is in the inactive mode.

10. The device of claim 8 wherein the power management circuitry includes:

control circuitry to detect if the portion of the integrated circuits is in the inactive mode and, in response, to generate a control signal; and switch circuitry to electrically couple the solar cell to the battery in response to the control signal.

11. The device of claim 8 wherein the power management circuitry includes control circuitry to detect if the portion of the integrated circuits is in the inactive mode and, in response thereto, to electrically couple the solar cell to the battery.

12. The device of claim 8 further including an anti-reflective layer disposed in or on a second major surface of the substrate wherein the anti-reflective layer enhances the efficiency or operation of the solar cell.

13. A device including a plurality of integrated circuits and a plurality of solar cells, each disposed in or on a first major surface of a substrate, the device comprising:

the plurality of integrated circuits, disposed in or on the first major surface of the substrate, include:

a plurality of PMOS transistors, each PMOS transistor disposed (i) in or on the first major surface of the substrate and (ii) in or on an n-well;

a plurality of NMOS transistors, each NMOS transistor disposed (i) in or on the first major surface of the substrate and (i) outside of the n-well;

a doped region disposed in or on a second major surface, opposing the first major surface, of the substrate, wherein the doped region enhances the efficiency or operation of the solar cell;

the plurality of solar cells, disposed in or on the first major surface of the substrate, each include (i) an n-type region in or on an n-well and (ii) a p-type region disposed outside of the n-well; and power management circuitry, coupled to a battery, to selectively and electrically couple at least a subset of the plurality of solar cells to the battery when at least a portion of the integrated circuits is in an inactive mode.

14. The device of claim 13 wherein the power management circuitry includes switch circuitry to responsively and electrically couple the subset of the plurality of solar cells to the battery when the plurality of integrated circuits are in the inactive mode.

15. The device of claim 13 wherein the power management circuitry includes:

control circuitry to detect if the plurality of integrated circuits are in the inactive mode and, in response thereto, to generate a control signal; and switch circuitry to electrically couple the subset of the plurality of solar cells to the battery in response to the control signal.

16. The device of claim 13 wherein the power management circuitry includes control circuitry to detect if the plurality of integrated circuits are in the inactive mode and, in response thereto, to electrically couple the subset of the plurality of solar cells to the battery.

17. The device of claim 13 further including an anti-reflective layer disposed in or on a second major surface of the substrate wherein the anti-reflective layer enhances the efficiency or operation of the solar cells.

* * * * *